(12) United States Patent
Chen et al.

(10) Patent No.: US 12,684,751 B2
(45) Date of Patent: Jul. 14, 2026

(54) STATIC RANDOM ACCESS MEMORY INCLUDING THREE-DIMENSIONAL DIODES

(71) Applicant: United Microelectronics Corp., Hsinchu (TW)

(72) Inventors: Hsin-Hsien Chen, New Taipei City (TW); Sheng-Yuan Hsueh, Tainan City (TW); Chih-Kai Kang, Tainan City (TW); Kuo-Hsing Lee, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 469 days.

(21) Appl. No.: 18/337,434

(22) Filed: Jun. 20, 2023

(65) Prior Publication Data

US 2024/0397689 A1 Nov. 28, 2024

(30) Foreign Application Priority Data

May 23, 2023 (TW) ................................. 112119167

(51) Int. Cl.
H10B 10/00 (2023.01)
(52) U.S. Cl.
CPC .................................... H10B 10/12 (2023.02)

(58) Field of Classification Search
CPC ...................................................... H10B 10/12
See application file for complete search history.

(56) References Cited

U.S. PATENT DOCUMENTS

| | | | |
|---|---|---|---|
| 6,590,800 B2 | 7/2003 | Chang | |
| 2015/0069411 A1* | 3/2015 | Esteve | H10D 62/107 |
| | | | 257/280 |
| 2019/0252376 A1* | 8/2019 | Kim | H10D 62/151 |
| 2020/0227421 A1* | 7/2020 | Jeong | H10B 10/12 |

* cited by examiner

*Primary Examiner* — Afroza Chowdhury
(74) *Attorney, Agent, or Firm* — JCIPRNET

(57) ABSTRACT

A static random access memory (SRAM) includes a first memory cell. The first memory cell includes: a first pull-down transistor, a first pull-up transistor, a second pull-up transistor, and a second pull-down transistor arranged on a first segment of a first fin, a first segment of a second fin, a first segment of a third fin and a first segment of a fourth fin of a substrate, respectively. The first memory cell further includes a first diode and a second diode. The first diode includes a first conductive feature in contact with a top surface and multiple upper sidewalls of a first end of the first segment of the first fin. The second diode includes a second conductive feature in contact with a top surface and multiple upper sidewalls of a second end of the first segment of the fourth fin.

19 Claims, 5 Drawing Sheets

STATIC RANDOM ACCESS MEMORY INCLUDING THREE-DIMENSIONAL DIODES

CROSS-REFERENCE TO RELATED APPLICATION

This application claims the priority benefit of Taiwan application serial no. 112119167, filed on May 23, 2023. The entirety of the above-mentioned patent application is hereby incorporated by reference herein and made a part of this specification.

BACKGROUND

Technical Field

The embodiments of the present disclosure relate to a memory, and particularly to a static random access memory.

Description of Related Art

The static random access memory (SRAM) has the characteristics of fast operation and low power consumption. As compared with the dynamic random access memory (DRAM), the static random access memory is simpler in design and manufacturing. Therefore, the static random access memory is widely used in electronic products. However, how to further reduce the area occupied by the static random access memory and improve the electrical performance of the static random access memory is the goal of continuous efforts.

SUMMARY

The disclosure provides a static random access memory, which has a smaller size and therefore reduces the occupied area of a chip. In addition, it can be used in high-speed switching-related applications and has better electrical properties.

A static random access memory (SRAM) according to an embodiment of the present disclosure includes a first memory cell. The first memory cell includes: a first pull-down transistor, a first pull-up transistor, a second pull-up transistor, and a second pull-down transistor arranged on a first segment of a first fin, a first segment of a second fin, a first segment of a third fin and a first segment of a fourth fin of a substrate, respectively. The first memory cell further includes a first diode and a second diode. The first diode includes a first conductive feature in contact with a top surface and a plurality of upper sidewalls of a first end of the first segment of the first fin. The second diode includes a second conductive feature in contact with a top surface and a plurality of upper sidewalls of a second end of the first segment of the fourth fin.

A static random access memory according to an embodiment of the present disclosure includes a semiconductor substrate, a plurality of transistors, a first three-dimensional diode and a second three-dimensional diode. The transistors are disposed on the semiconductor substrate. The first three-dimensional diode includes a first conductive feature located on a top surface of the semiconductor substrate and extending into the semiconductor substrate. The second three-dimensional diode includes a second conductive feature located on the top surface of the semiconductor substrate and extending into the semiconductor substrate.

Based on the above, the static random access memory in the embodiment of the present disclosure includes a three-dimensional diode with a smaller size, so the occupied chip area can be reduced. In addition, it is suitable for high-speed switching-related applications with low leakage current.

DESCRIPTION OF THE EMBODIMENTS

Figure 1:
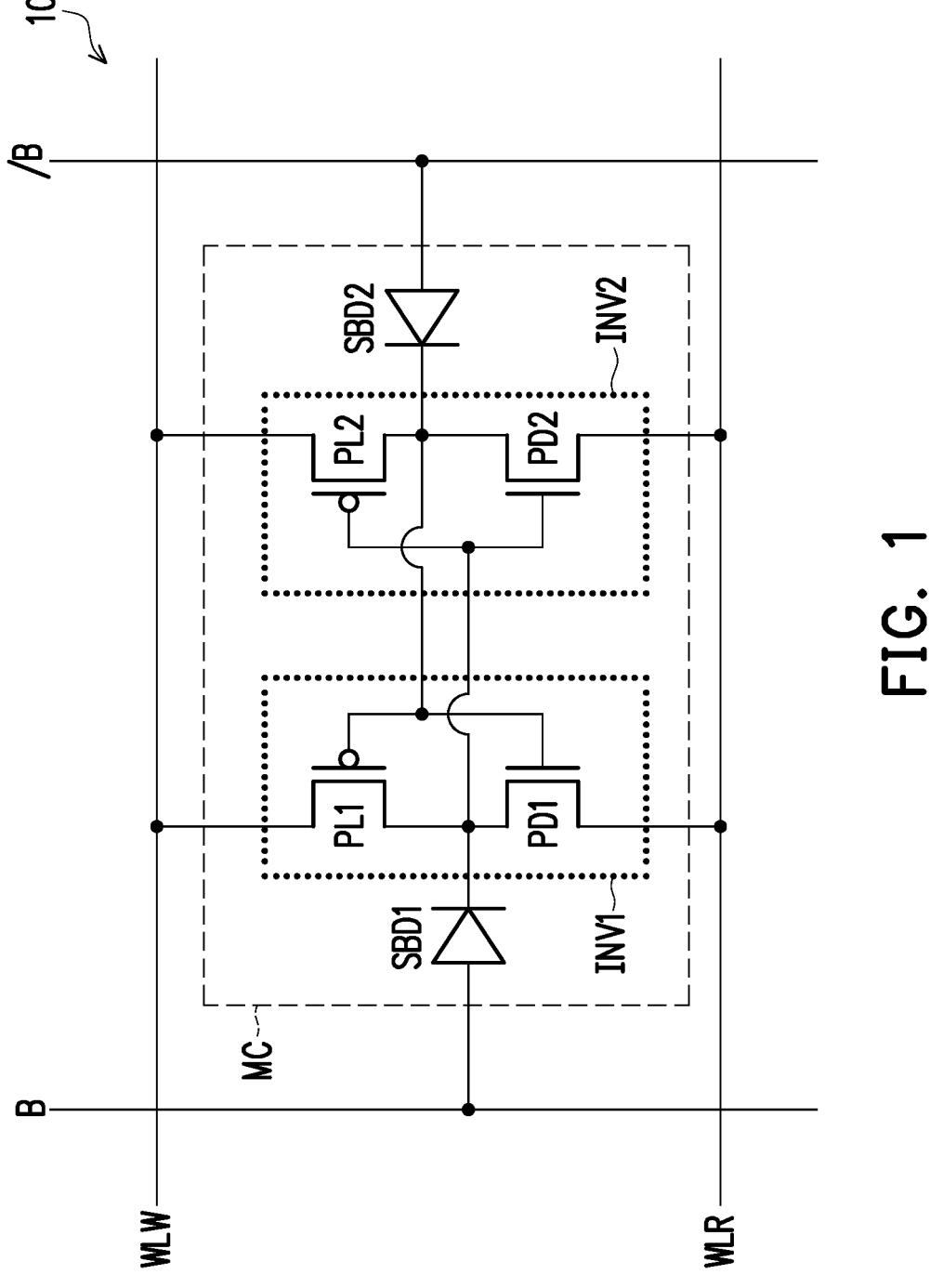
FIG. 1 is a simplified circuit diagram of a static random access memory according to an embodiment of the present disclosure.

FIG. 1 is a simplified circuit diagram of a static random access memory according to an embodiment of the present disclosure.

Referring to FIG. 1, the static random access memory 10 includes at least one memory cell MC. The memory cell MC includes an inverter INV1, an inverter INV2, a three-dimensional diode SBD1 and a three-dimensional diode SBD2. The inverter INV1 and the inverter INV2 are coupled to each other; that is, the output terminal of the inverter INV1 is connected to the input terminal of the inverter INV2, and the output terminal of the inverter INV2 is connected to the input terminal of the inverter INV1. In some embodiments, the inverter INV1 may include a pull-up transistor PL1 and a pull-down transistor PD1 coupled to each other, and the inverter INV2 may include a pull-up transistor PL2 and a pull-down transistor PD2 coupled to each other.

The positive electrode of the three-dimensional diode SBD1 is connected to a bit line B, and the negative electrode is connected to the input terminal of the inverter INV1. The positive electrode of the three-dimensional diode SBD2 is connected to the bit line/B, and the negative electrode is connected to the input terminal of the inverter INV2. A writing word line WLW is coupled to the first source/drain terminal of the pull-up transistor PL1 and the first source/drain terminal of the pull-up transistor PL2. A reading word line WLR is coupled to the second source/drain terminal of the pull-down transistor PD1 and the second source/drain terminal of the pull-down transistor PD1. The operation of this circuit is basically similar to that of 6T SRAM.

In the embodiment of the present disclosure, two three-dimensional diodes are configured to replace channel transistors and the three-dimensional diodes can be Schottky barrier diodes, so the static random access memory 10 can be called a static random access memory integrated with Schottky barrier diodes (SBD-SRAM).

Figure 2:
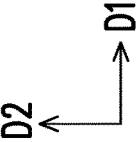
FIG. 2 is a top view of some components of a static random access memory according to an embodiment of the present disclosure.
Figure 3:
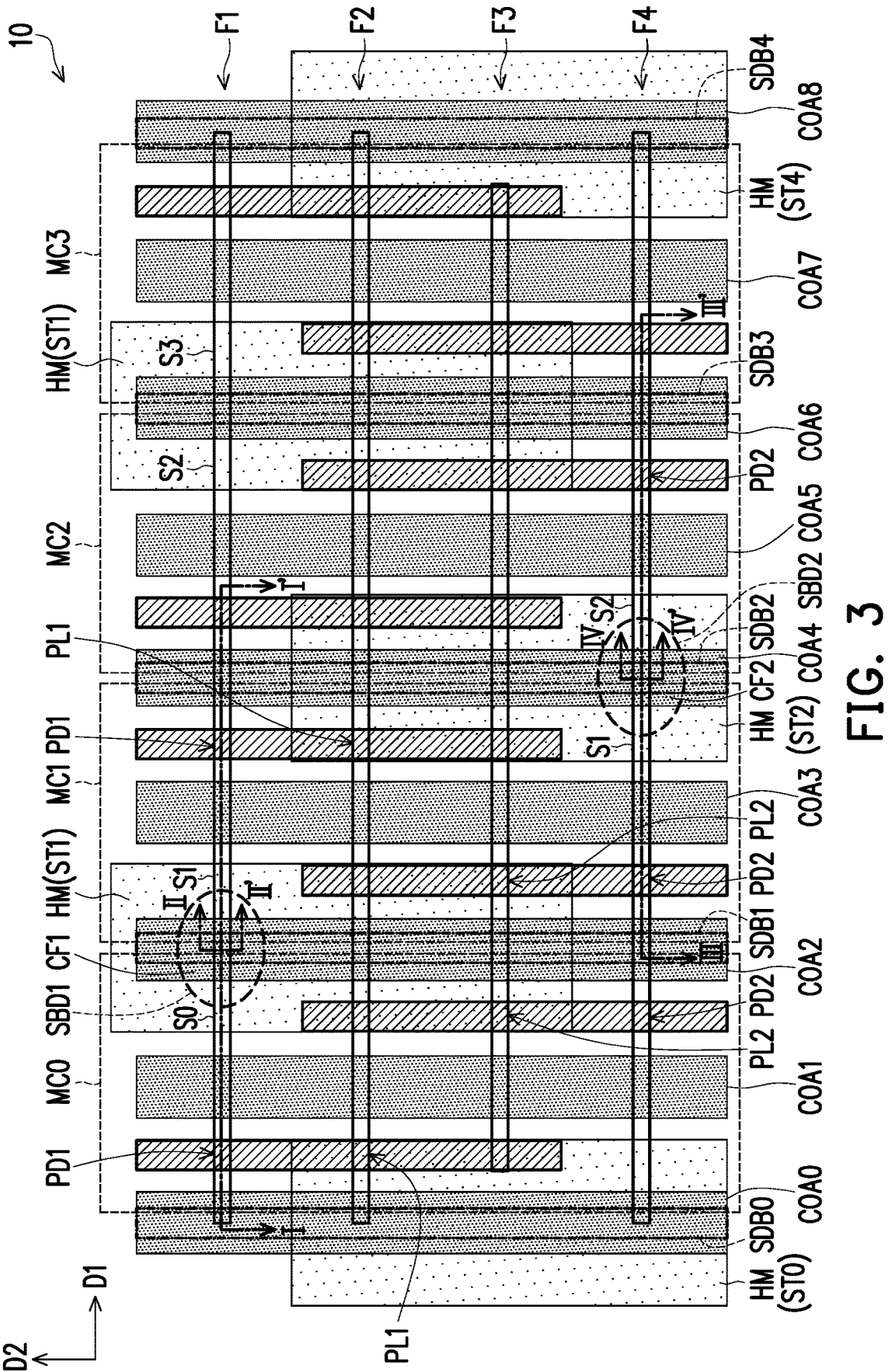
FIG. 3 is a top view of a static random access memory according to an embodiment of the present disclosure.
Figures 4A, 4B:
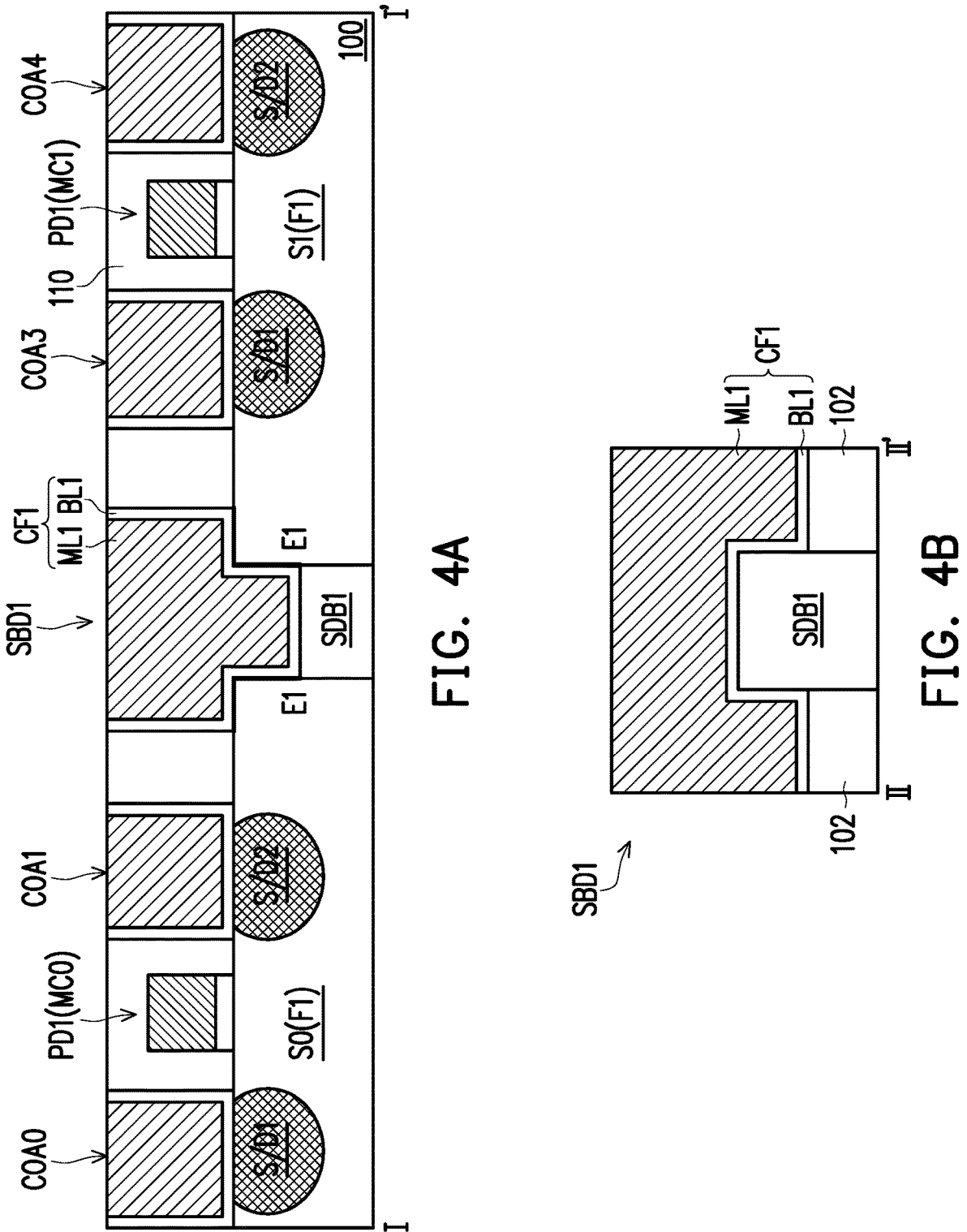
FIG. 4A and FIG. 4B are cross-sectional views taken along the lines I-I' and II-II' in FIG. 3, respectively.
Figures 5A, 5B:
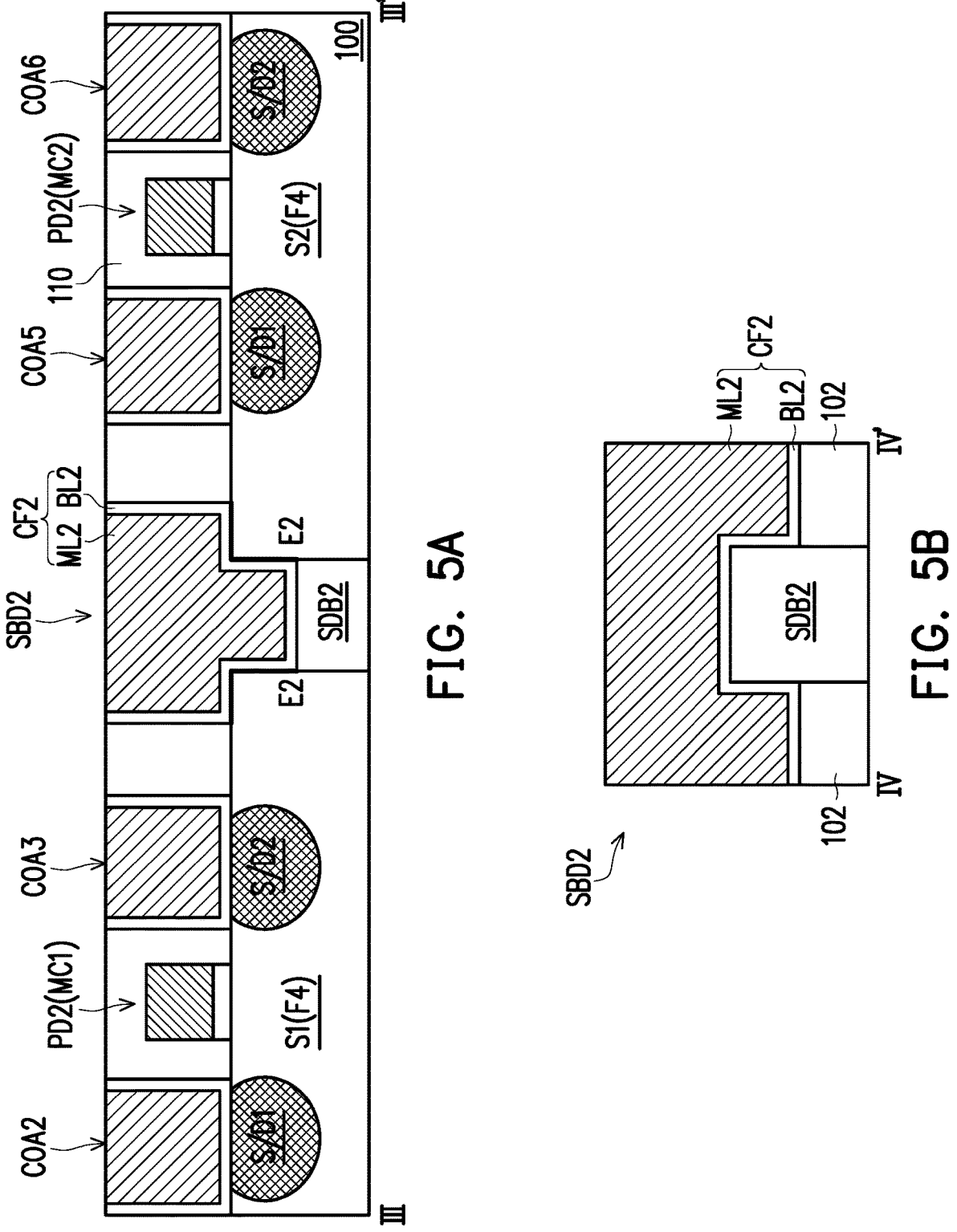
FIG. 5A and FIG. 5B are cross-sectional views taken along the lines III-III' and IV-IV' in FIG. 3, respectively.

FIG. 2 is a top view of some components of a static random access memory according to an embodiment of the present disclosure. FIG. 3 is a top view of a static random access memory according to an embodiment of the present disclosure. FIG. 4A and FIG. 4B are cross-sectional views taken along the lines I-I' and II-II' in FIG. 3, respectively. FIG. 5A and FIG. 5B are cross-sectional views taken along the lines III-III' and IV-IV' in FIG. 3, respectively.

Referring to FIG. 2 and FIG. 3, the static random access memory 10 may include multiple memory cells, such as MC0, MC1, MC2, MC4, etc. The static random access memory 10 includes a substrate 100. The substrate 100 may include multiple fins F1-F4 and F1'-F4'. The fins F1-F4 and F1'-F4' may extend continuously or discontinuously along a direction D1.

Referring to FIG. 3, the static random access memory 10 includes multiple diffusion break structures, such as diffusion break structures SDB0-SDB4. The diffusion break structures SDB0-SDB4 respectively extend along a direction D2, respectively divide the fins F1-F4 and F1'-F4' into multiple segments S0-S3, and are in contact with the sidewalls of ends E1 and E2 of the segments S0-S3, as shown in FIG. 4A and FIG. 5A.

Referring to FIG. 3, each diffusion break structure separates two adjacent memory cells from each other. For example, the diffusion break structure SDB1 is disposed between the memory cells MC0 and MC1 and separates the memory cell MC0 from the memory cell MC1. The diffusion break structure SDB2 is disposed between the memory cells MC1 and MC2 and separates the memory cell MC1 from the memory cell MC2. The diffusion break structure SDB3 is disposed between the memory cells MC2 and MC3 and separates the memory cell MC2 from the memory cell MC3.

Referring to FIG. 3, each memory cell, such as memory cell MC1, includes pull-down transistors PD1, PD2, pull-up transistors PL1, PL2, and diodes SBD1, SBD2. The pull-down transistor PD1 of the memory cell MC1 is disposed on the segment S1 of the fin F1. The pull-up transistor PL1 is disposed on the segment S1 of the fin F2. The pull-up transistor PL2 is disposed on the segment S1 of the fin F3. The pull-down transistor PD2 is disposed on the segment S1 of the fin F4.

Referring to FIG. 3, the gate of the pull-down transistor PD1 and the gate of the pull-up transistor PL1 of the memory cell MC1 extend in the direction D2 and are connected to each other, and are disposed across the segments S1 of the fins F1 and F2, and even across the segment S1 of the fin F3. The gate of the pull-down transistor PD2 and the gate of the pull-up transistor PL2 extend in the direction D2 and are connected to each other, and are disposed across the segments S1 of the fins F4 and F3, and even across the segment S1 of the fin F2.

Referring to FIG. 3 and FIG. 4A, the diode SBD1 is disposed between the memory cells MC0 and MC1. In other words, the memory cells MC1 and MC0 share the diode SBD1. The diode SBD1 is, for example, disposed between the pull-down transistor PD1 of the memory cell MC0 and the pull-down transistor PD1 of the memory cell MC1. The diode SBD1 has a three-dimensional structure. The diode SBD1 is disposed between the segment S0 and the segment S1 of the fin F1, and landed on the surfaces of the diffusion break structure SDB1 and the segments S0 and S1 of the fin F1.

Referring to FIG. 4A and FIG. 4B, the diode SBD1 of the embodiment of the present disclosure is a Schottky barrier diode. The diode SBD1 includes a conductive feature CF1 and part of fin F1.

In some embodiments, the conductive feature CF1 includes a metal contact ML1. In some other embodiments, the conductive feature CF1 further includes a barrier layer BL1, and the metal contact ML1 is located on the barrier layer BL1. The material of the metal contact ML1 may include tungsten (W). The material of the barrier layer BL1 may include tantalum (Ta), tantalum nitride (TaN), titanium (Ti), titanium nitride (TiN) or a combination thereof, such as Ta/TaN or Ti/TiN. The fin F1 includes semiconductor, such as silicon. Therefore, the metal contact ML1, the barrier layer BL1 and the fin F1 can form a Schottky barrier diode. The Schottky barrier diode is suitable for high-speed switching-related applications and has low leakage current due to its small forward voltage and short reverse recovery time.

In FIG. 4A, the conductive feature CF1 is formed in the dielectric layer 110 above the substrate 100. A cross-cross-section of conductive feature CF1 is T-shaped. The conductive feature CF1 is located on the top surface of the substrate 100 and extends into the substrate 100. In other words, the conductive feature CF1 covers the corner of the first end E1 of the segment S1 of the fin F1, and is in contact with the top surface and the upper sidewalls of the first end E1 of the segment S1 of the fin F1. The conductive feature CF1 further covers the corner of the first end E1 of the segment S0 of the fin F1, and is in contact with the top surface and the upper sidewalls of the first end E1 of the segment S0 of the fin F1. The bottom surface of conductive feature CF1 is in contact with diffusion break structure SDB1.

In FIG. 4B, another cross-section of conductive feature CF1 has an inverted U-shape. The conductive feature CF1 covers the top surface and the upper sidewalls of the diffusion break structure SDB1, and covers the isolation structures 102 in the substrate 100.

Referring to FIG. 3, the diode SBD2 of the memory cell MC1 is disposed between the segment S1 and the segment S2 of the fin F4. The diode SBD2 is landed on the diffusion break structure SDB2. The diode SBD2 is disposed between memory cells MC1 and MC2. In other words, the memory cells MC1 and MC2 share the diode SBD2. The diode SBD2 is, for example, disposed between the pull-down transistor PD2 of the memory cell MC1 and the pull-down transistor PD2 of the memory cell MC2. The diode SBD2 has a three-dimensional structure. The diode SBD2 is disposed between the segment S1 and the segment S2 of the fin F4, and is landed on the surfaces of the diffusion break structure SDB2 and the segments S1 and S2 of the fin F4.

Referring to FIG. 5A and FIG. 5B, the diode SBD2 of the embodiment of the present disclosure is a Schottky barrier diode. The diode SBD2 includes a conductive feature CF2 and part of fin F4. In some embodiments, the conductive feature CF2 includes a metal contact ML2. In some other embodiments, the conductive feature CF2 further includes a barrier layer BL2, and the metal contact ML2 is located on the barrier layer BL2. The material of the metal contact ML2 may include tungsten (W). The material of the barrier layer BL2 may include tantalum (Ta), tantalum nitride (TaN), titanium (Ti), titanium nitride (TiN) or a combination thereof. The fin F4 includes semiconductor, such as silicon. Therefore, the metal contact ML2, the barrier layer BL2 and the fin F4 can form a Schottky barrier diode.

In FIG. 5A, the conductive feature CF2 is formed in the dielectric layer 110 above the substrate 100. A cross-section of conductive feature CF2 is T-shaped. The conductive feature CF2 is located on the top surface of the substrate 100 and extends into the substrate 100. In other words, the conductive feature CF2 covers the corner of the second end E2 of the segment S1 of the fin F4, and is in contact with the top surface and the upper sidewalls of the second end E2 of the segment S1 of the fin F4. The conductive feature CF2 further cover the corner of the second end E2 of the segment S2 of the fin F4, and is in contact with the top surface and the upper sidewalls of the first end E2 of the segment S2 of the fin F4. The bottom surface of the conductive feature CF2 is in contact with the diffusion break structure SDB2.

In FIG. 5B, another cross-section of the conductive feature CF2 has an inverted U-shape. The conductive feature CF2 covers the top and upper sidewalls of the diffusion break structure SDB2.

Referring to FIG. 3, FIG. 4A and FIG. 5A, the conductive features CF1 and CF2 and contacts COA0-COA8 formed in the dielectric layer 110 (shown in FIG. 4A and FIG. 5A) respectively extend along the direction D2. The contacts COA0 and COA1 are respectively connected to the source/drain regions S/D1 and S/D2 of the pull-down transistor PD1 of the memory cell MC0, as shown in FIG. 4A. Referring to FIG. 3, the contacts COA0 and COA1 are also respectively connected to the source/drain regions (not shown) of the pull-up transistor PL1 of the memory cell MC0.

The contacts COA2 and COA3 are respectively connected to the source/drain regions S/D1 and S/D2 of the pull-down transistor PD2 of the memory cell MC1, as shown in FIG. 5A. Referring to FIG. 3, the contacts COA2 and COA3 are also respectively connected to the source/drain regions (not shown) of the pull-up transistor PL2 of the memory cell MC1.

Referring to FIG. 3 and FIG. 4A, the conductive feature CF1 is disposed between the contacts COA1 and COA3, and is connected to the contact COA2. Referring to FIG. 3 and FIG. 5A, the conductive feature CF2 is disposed between contacts COA3 and COA5, and is connected to contact COA4.

Referring to FIG. 3 and FIG. 4A, in an embodiment of the present disclosure, a semiconductor compound is formed and doped in the fin F1, so as to form the source/drain regions S/D1 and S/D2 of the pull-down transistor PD1. Similarly, a semiconductor compound is formed and doped in the fin F4, so as to form source/drain regions (not shown) of the pull-down transistor PD2.

Referring to FIG. 3, FIG. 4A and FIG. 5A, no additional doped region and no semiconductor compound are formed in the fins F1 and F4 of the diode SBD1 and the diode SBD2. Referring to FIG. 3, before the epitaxial process is performed to form the semiconductor compound of the source/drain regions of the pull-down transistors PD1 and PD2, a mask layer HM may be formed above the substrate 100. The mask layer HM includes multiple strips ST0-ST4. The strips ST0-ST4 respectively extend along the direction D2 and cover local areas of the fins F1-F4. For example, the strip ST1 covers the local area of the segments S0 and S1 of the fin F1 that is intended to form the diode SBD1 shared by the memory cells MC0 and MC1.

In the embodiment of the present disclosure, three-dimensional diodes are configured to replace channel transistors. The three-dimensional diodes in the embodiment of the present disclosure are Schottky barrier diodes. As compared with a transistor, the Schottky barrier diode of the disclosure has a smaller size, occupies less chip area, and exhibits high flexibility in future applications. In addition, the Schottky barrier diode is suitable for high-speed switching-related applications and has low leakage current due to its small forward voltage and short reverse recovery time. On the other hand, the fabrication of the three-dimensional diode can be integrated with the existing process, so the process can be simplified.

What is claimed is:

1. A static random access memory, comprising:
a substrate, comprising a first fin, a second fin, a third fin, and a fourth fin; and
a first memory cell, comprising:

a first pull-down transistor, disposed on a first segment of the first fin;
a first pull-up transistor, disposed on a first segment of the second fin;
a second pull-up transistor, disposed on a first segment of the third fin;
a second pull-down transistor, disposed on a first segment of the fourth fin;
a first diode, comprising a first conductive feature in contact with a top surface and a plurality of upper sidewalls of a first end of the first segment of the first fin; and
a second diode, comprising a second conductive feature in contact with a top surface and a plurality of upper sidewalls of a second end of the first segment of the fourth fin.

2. The static random access memory of claim 1, wherein the first diode is landed on a first diffusion break structure.

3. The static random access memory of claim 2, further comprising a second memory cell, wherein the first diffusion break structure is located between the first memory cell and the second memory cell.

4. The static random access memory of claim 3, wherein the first conductive feature is further in contact with a top surface and a plurality of upper sidewalls of a first end of a second segment of the first fin.

5. The static random access memory of claim 4, wherein the first conductive feature comprises a first metal contact and a first barrier layer, and the first metal contact is located on the first barrier layer.

6. The static random access memory of claim 4, wherein the first diffusion break structure separates the first segment from the second segment of the first fin, separates the first segment from a second segment of the second fin, separates the first segment from a second segment of the third fin second segment, and separates the first segment from a second segment of the fourth fin.

7. The static random access memory of claim 1, wherein the second diode is landed on a second diffusion break structure.

8. The static random access memory of claim 7, wherein the second diffusion break structure is in contact with a second end of the first segment of the first fin, and is in contact with a second end of the first segment of the fourth fin.

9. The static random access memory of claim 7, wherein the second conductive feature comprises a second metal contact and a second barrier layer, and the second metal contact is located on the second barrier layer.

10. The static random access memory of claim 7, further comprising a third memory cell, wherein the second diffusion break structure is located between the first memory cell and the third memory cell.

11. The static random access memory of claim 1, wherein first cross-sections of the first conductive feature and the second conductive feature are T-shaped, respectively.

12. The static random access memory of claim 1, wherein second cross-sections of the first conductive feature and the second conductive feature are inverted U-shaped, respectively.

13. The static random access memory of claim 1, wherein the first diode and the second diode are three-dimensional Schottky barrier diodes.

14. A static random access memory, comprising:
a semiconductor substrate;
a plurality of transistors, disposed on the semiconductor substrate;

a first three-dimensional diode, comprising a first conductive feature located on a top surface of the semiconductor substrate and extending into the semiconductor substrate; and a second three-dimensional diode, comprising a second conductive feature located on the top surface of the semiconductor substrate and extending into the semiconductor substrate, wherein the first conductive feature is in contact with a top surface and a plurality of sidewalls of a first semiconductor fin of the semiconductor substrate, and the second conductive feature is in contact with a top surface and a plurality of sidewalls of a second semiconductor fin of the semiconductor substrate.

15. The static random access memory of claim 14, wherein the first three-dimensional diode is shared by a first memory cell and a second memory cell adjacent to each other, and the second three-dimensional diode is shared by the first memory cell and a third memory cell adjacent to each other.

16. The static random access memory of claim 15, wherein the first three-dimensional diode is located between two first pull-down transistors of two adjacent memory cells, and the second three-dimensional diode is located between two second pull-down transistors of two adjacent memory cells.

17. The static random access memory of claim 14, wherein the first three-dimensional diode is landed on a first diffusion break structure, and the second three-dimensional diode is landed on a second diffusion break structure.

18. The static random access memory of claim 14, wherein the first conductive feature comprises a first metal contact and a first barrier layer, the first metal contact is located on the first barrier layer, the second conductive feature comprises a second metal contact and a second barrier layer, and the second metal contact is located on the second barrier layer.

19. The static random access memory of claim 14, wherein first cross-sections of the first conductive feature and the second conductive feature are T-shaped, respectively, and second cross-sections of the first conductive feature and the second conductive feature are inverted U-shaped, respectively.

\* \* \* \* \*